(12) United States Patent
Ohara et al.

(10) Patent No.: US 11,832,499 B2
(45) Date of Patent: Nov. 28, 2023

(54) SENSOR

(71) Applicant: OMRON Corporation, Kyoto (JP)

(72) Inventors: Hidekazu Ohara, Kyoto (JP); Tsuyoshi Miyata, Ayabe (JP)

(73) Assignee: OMRON Corporation, Kyoto (JP)

( * ) Notice: Subject to any disclaimer, the term of this patent is extended or adjusted under 35 U.S.C. 154(b) by 32 days.

(21) Appl. No.: 17/432,940

(22) PCT Filed: Feb. 26, 2020

(86) PCT No.: PCT/JP2020/007689
§ 371 (c)(1),
(2) Date: Aug. 23, 2021

(87) PCT Pub. No.: WO2020/179573
PCT Pub. Date: Sep. 10, 2020

(65) Prior Publication Data
US 2022/0173175 A1 Jun. 2, 2022

(30) Foreign Application Priority Data

Mar. 4, 2019 (JP) .................................. 2019-038686

(51) Int. Cl.
*H10K 59/60* (2023.01)
*H10K 50/87* (2023.01)

(52) U.S. Cl.
CPC ............ *H10K 59/60* (2023.02); *H10K 50/87* (2023.02)

(58) Field of Classification Search
CPC . H01L 31/024; H01L 27/3227; H01L 51/529; H05K 5/0091; H05K 5/04
See application file for complete search history.

(56) References Cited

U.S. PATENT DOCUMENTS

| | | | |
|---|---|---|---|
| 2005/0068666 A1* | 3/2005 | Albrecht | G11B 33/1466 360/99.18 |
| 2006/0261452 A1* | 11/2006 | Berchtold | H05K 5/069 257/E23.185 |
| 2007/0072452 A1* | 3/2007 | Inagaki | H05K 5/0043 439/76.2 |

(Continued)

FOREIGN PATENT DOCUMENTS

| | | |
|---|---|---|
| JP | S5597989 | 7/1980 |
| JP | H04159799 | 6/1992 |

(Continued)

OTHER PUBLICATIONS

"Office Action of Japan Counterpart Application" with English translation thereof, dated Mar. 29, 2022, p. 1-p. 6.

(Continued)

*Primary Examiner* — Yuzhen Shen
(74) *Attorney, Agent, or Firm* — JCIPRNET

(57) ABSTRACT

A sensor includes a metal housing and a metal lid. The metal housing houses a circuit board electrically connected to a sensor element and is provided with an opening and an edge part defining the opening. The metal lid is adhered to the edge part to cover the opening. At least one of the edge part and the metal lid is provided with one or more recesses, and the metal lid is adhered to the edge part by a portion of an adhesive agent filled in the recess that is located in a region of an opening end of the recess.

11 Claims, 4 Drawing Sheets

(56) References Cited

U.S. PATENT DOCUMENTS

| | | | | |
|---|---|---|---|---|
| 2008/0237203 A1* | 10/2008 | Tanaka | .................. | C09J 5/06 |
| | | | | 219/121.64 |
| 2010/0103632 A1* | 4/2010 | Kato | ................ | H05K 5/006 |
| | | | | 361/752 |
| 2016/0179328 A1* | 6/2016 | Yang | ................ | G06F 3/04842 |
| | | | | 715/863 |
| 2019/0097643 A1* | 3/2019 | Nishida | ............ | H01S 5/06804 |

FOREIGN PATENT DOCUMENTS

| | | |
|---|---|---|
| JP | 2006524910 | 11/2006 |
| JP | 2010272561 | 12/2010 |
| JP | 2017157487 | 9/2017 |
| JP | 6394626 | 9/2018 |
| JP | 2018152227 | 9/2018 |

OTHER PUBLICATIONS

"International Search Report (Form PCT/ISA/210) of PCT/JP2020/007689," dated May 12, 2020, with English translation thereof, pp. 1-4.

"Written Opinion of the International Searching Authority (Form PCT/ISA/237) of PCT/JP2020/007689," dated May 12, 2020, with English translation thereof, pp. 1-8.

"Search Report of Europe Counterpart Application", dated Oct. 28, 2022, pp. 1-7.

* cited by examiner

SENSOR

CROSS-REFERENCE TO RELATED APPLICATION

This application is a 371 application of the International PCT application serial no. PCT/JP2020/007689, filed on Feb. 26, 2020, which claims the priority benefits of Japan Patent Application No. 2019-038686, filed on Mar. 4, 2019. The entirety of each of the above-mentioned patent applications is hereby incorporated by reference herein and made a part of this specification.

BACKGROUND

Technical Field

The disclosure relates to a sensor.

Description of Related Art

Among sensors, some sensors include a housing that houses a sensor element, a circuit board electrically connected to the sensor element, etc., and a lid for covering an opening of the housing. Further, in the sensor, when the housing and the lid are both made of metal, there is a method of sealing the metal housing with the metal lid by laser welding. For example, Patent Document 1 below discloses a sensor device in which a main body cover is assembled to cover a side opening provided on the side surface of a main body case, and the main body cover is fixed to the main body case by laser welding over the periphery and the entire circumference of the side opening of the main body case.

RELATED ART

Patent Document(s)

[Patent Document 1] Japanese Patent No. 6394626

SUMMARY

Problems to be Solved

In the case where the sensor is provided with an organic EL display as a display part for displaying various numerical values, when the metal housing and the metal lid are laser-welded as described above, there is an issue that the organic display is deteriorated by the heat at the time of laser welding.

To prevent the deterioration of the organic display, for example, instead of laser welding, there is a method of fixing the metal housing and the metal lid by an adhesive agent. However, in such a fixing method, since the thermal conductivity of the adhesive agent is lower than that of metal, as illustrated in FIG. 4, in a conventional sensor 60, it becomes difficult for the heat generated from a circuit board 400 housed in a metal housing 100 to be dissipated beyond a metal lid 200 due to the influence of a layer of an adhesive agent 500. As such, when the metal housing and the metal lid are fixed by an adhesive agent, there is an issue that heat dissipation of the sensor deteriorates.

Therefore, an objective of the disclosure is to improve heat dissipation in a sensor in which a metal lid is adhered to a metal housing.

Means for Solving the Problems

A sensor according to an embodiment of the disclosure includes a metal housing and a metal lid. The metal housing houses a circuit board electrically connected to a sensor element and is provided with an opening and an edge part defining the opening. The metal lid is adhered to the edge part to cover the opening. At least one of the edge part and the metal lid is provided with one or more recesses, and the metal lid is adhered to the edge part by a portion of an adhesive agent filled in the recess that is located in a region of an opening end of the recess.

According to this embodiment, in the sensor, the heat generated from the circuit board and transferred to the metal lid is also transferred to the metal housing through the portion at which the edge part and the metal lid come into contact with each other, other than the portion at which the recess is provided in the edge part of the metal housing or the metal lid. Therefore, according to this embodiment, the sensor can reduce the heat transferred to the metal lid from concentrating on the metal lid. Accordingly, heat dissipation can be improved in the sensor in which the metal lid is adhered to the metal housing.

In the above embodiment, the recess may be a columnar hole.

According to this embodiment, the adhesive agent filled in the recess can be formed to extend in a direction perpendicular to the portion located in the region of the opening end of the recess; therefore, in place of the portion of the opening end of the recess, it is possible to secure a portion at which the edge part of the metal housing and the metal lid come into contact with each other.

In the above embodiment, a total area of an adhesion surface between the edge part and the metal lid at the recess may be equal to or less than half an area of an overlapping region between the edge part and the metal lid.

According to this embodiment, in the edge part of the metal housing or the metal lid, in place of the adhesion surface at the recess, it is possible to secure a portion at which the edge part of the metal housing and the metal lid come into contact with each other. Accordingly, the sensor can easily transfer heat from the metal lid to the metal housing and can improve heat dissipation.

In the above embodiment, the circuit board may have a control circuit for an organic EL display.

According to this embodiment, when the sensor is provided with an organic EL display which is more vulnerable to heat than a liquid crystal display or the like, since the metal lid is sealed by adhesion, the influence of heat on the organic EL display can be reduced as compared with welding by laser welding or the like.

In the above embodiment, the circuit board may have a laser control circuit.

According to this embodiment, when the sensor element is provided with a laser, the heat generated from the laser can be transferred to the metal housing through the portion at which the edge part of the metal housing and the metal lid come into contact with each other.

Effects

According to the disclosure, heat dissipation can be improved in a sensor in which a metal lid is adhered to a metal housing.

DESCRIPTION OF THE EMBODIMENTS

Figure 1:
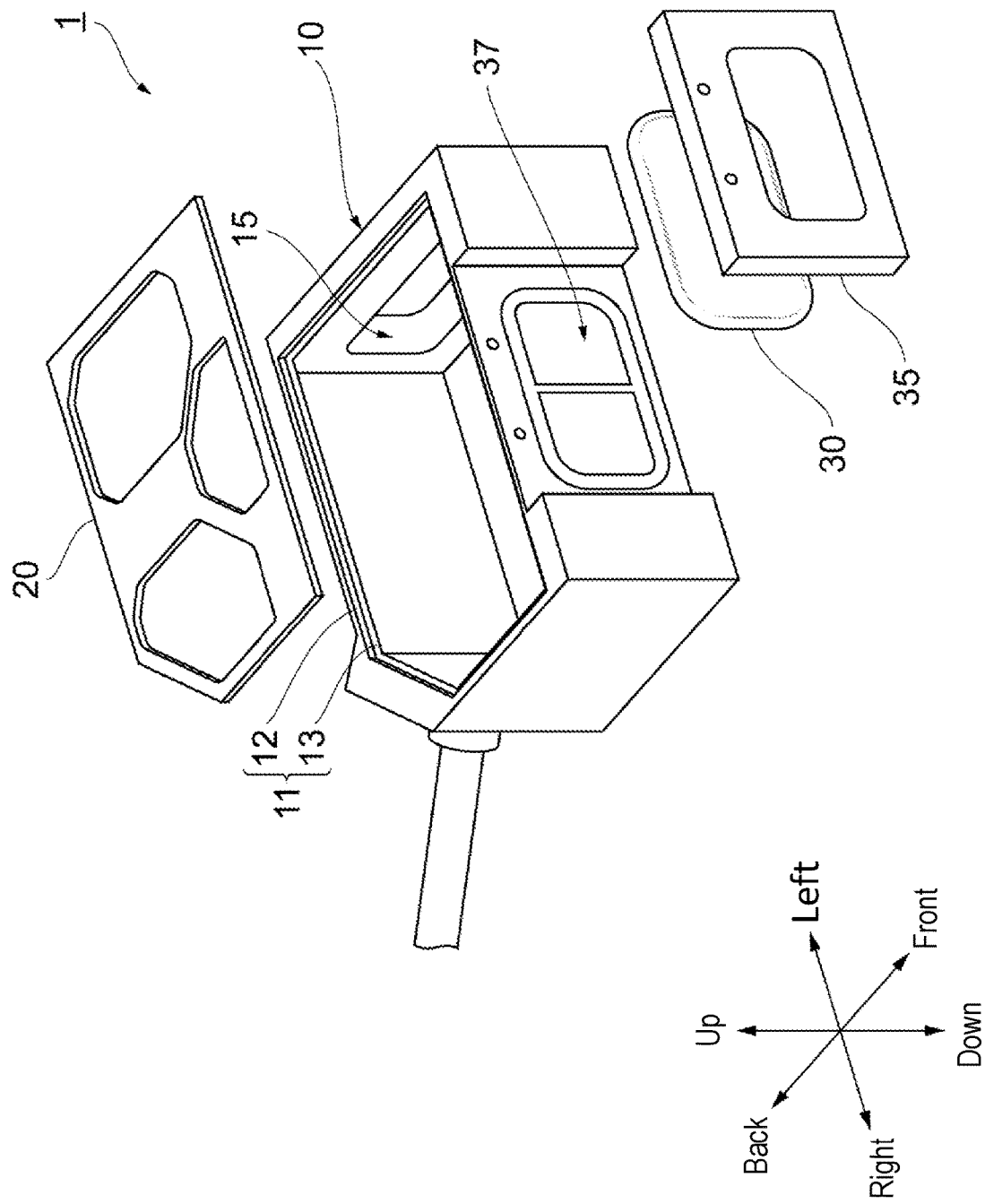
FIG. 1 is a perspective view showing a sensor according to an embodiment.

Preferred embodiments of the disclosure will be described with reference to the accompanying drawings. In the drawings, parts labeled with the same reference numerals have the same or similar configurations.

Figure 4:
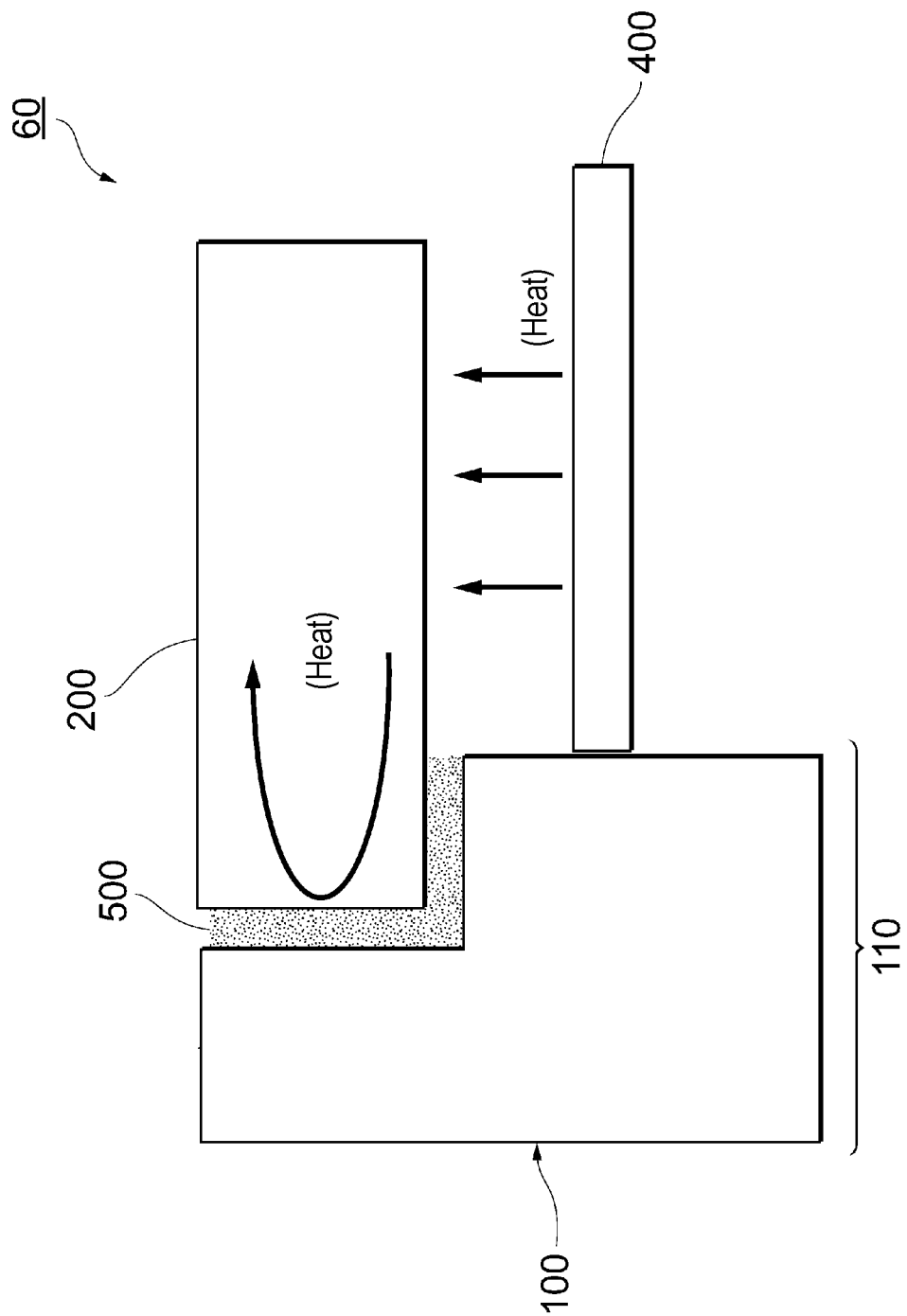
FIG. 4 is a schematic cross-sectional view showing a part of a metal housing and a metal lid of a conventional sensor.

FIG. 4 is an enlarged cross-sectional view schematically showing an adhered portion between a metal housing 100 and a metal lid 200 of a conventional sensor 60. The sensor 60 includes a sensor element (not shown), a circuit board 400 electrically connected to the sensor element, a metal housing 100, and a metal lid 200. The sensor 60 is assembled by housing the sensor element and the circuit board 400 in the metal housing 100 and attaching the metal lid 200 to the metal housing 100.

The metal lid 200 is joined to the metal housing 100 to cover an opening of the metal housing 100. Specifically, the metal lid 200 is fitted into an edge part 110 that defines the opening of the metal housing 100, and is joined to the metal housing 100 with a layer of an adhesive agent 500 interposed therebetween. Therefore, in the conventional sensor 60, as the thermal conductivity of the adhesive agent 500 is lower than that of the metal housing 100, the heat generated from the circuit board 400 is concentrated on the metal lid 200 and the circuit board 400.

Referring to FIG. 1, an overall configuration of a metal housing 10 and a metal lid 20 of a sensor 1 according to this embodiment will be described. FIG. 1 is an exploded perspective view of a part of the sensor 1 according to this embodiment. For convenience of illustration, the front/back/left/right and top/bottom orientations are based on those shown in FIG. 1. In the example of FIG. 1, the metal lid 20 is configured to cover an opening 15 of the metal housing 10 from above. In this example, the sensor 1 will be described as a photoelectric sensor as an example, but the disclosure is not limited thereto, and the sensor 1 may also serve as various types of sensors.

The sensor 1 is a photoelectric sensor for detecting the presence or the like of an object by projecting light or receiving light. The sensor 1 includes, for example, a metal housing 10, a metal lid 20, a cover lens 30, and a lens cover 35, as shown in FIG. 1. Further, the sensor 1 may be provided with a display part (not shown) for displaying various numerical values. The display part is, for example, an organic EL display, a liquid crystal display, or the like.

The metal housing 10 is a component for housing an optical component. The metal housing 10 is provided with an opening 15 and an edge part 11. The metal housing 10 is formed of a metal such as stainless steel, and may have a substantially rectangular parallelepiped shape, for example. An optical component including a sensor element (not shown) and a circuit board (see FIG. 2) electrically connected to the sensor element is housed in the metal housing 10. With respect to the metal housing 10, having a "substantially rectangular parallelepiped shape" means that it may include surfaces other than the six surfaces constituting the rectangular parallelepiped, the internal angles may not all be 90 degrees, or the shape may be different from an exact rectangular parallelepiped shape.

The metal lid 20 is formed of a metal such as stainless steel and is formed to cover the opening 15 of the metal housing 10.

The edge part 11 defines the opening 15. The edge part 11 has a first edge part 12 and a second edge part 13. The first edge part 12 is formed to surround and fix the entire outer circumference of the metal lid 20 when the metal lid 20 is fitted into the first edge part 12.

The second edge part 13 is formed to overlap with an outer circumferential portion of the metal lid 20 when the metal lid 20 is fitted into the first edge part 12 and placed on the second edge part 13. Further, the second edge part 13 defines the opening 15 and includes a joining region between the metal housing 10 and the metal lid 20. By joining the metal housing 10 and the metal lid 20 at the second edge part 13, the optical component housed in the metal housing 10 is sealed.

On the front surface of the metal housing 10, a light projecting and receiving opening 37 for passing projected or received light is provided, and the cover lens 30 which covers the light projecting and receiving opening 37 and the lens cover 35 which fixes the cover lens 30 are fitted.

The optical component is an optical component that projects light or receives light with respect to an object to be detected. The optical component includes a sensor element and a circuit board electrically connected to the sensor element. The sensor element is, for example, a light projecting element and/or a light receiving element. As the light projecting element, for example, an element such as an LED (light emitting diode) or an LD (laser diode) may be used. Further, the optical component includes a light projecting lens and a light receiving lens. Further, the optical component may include, for example, an amplifier for amplifying a signal received by the light receiving element.

Figure 2:
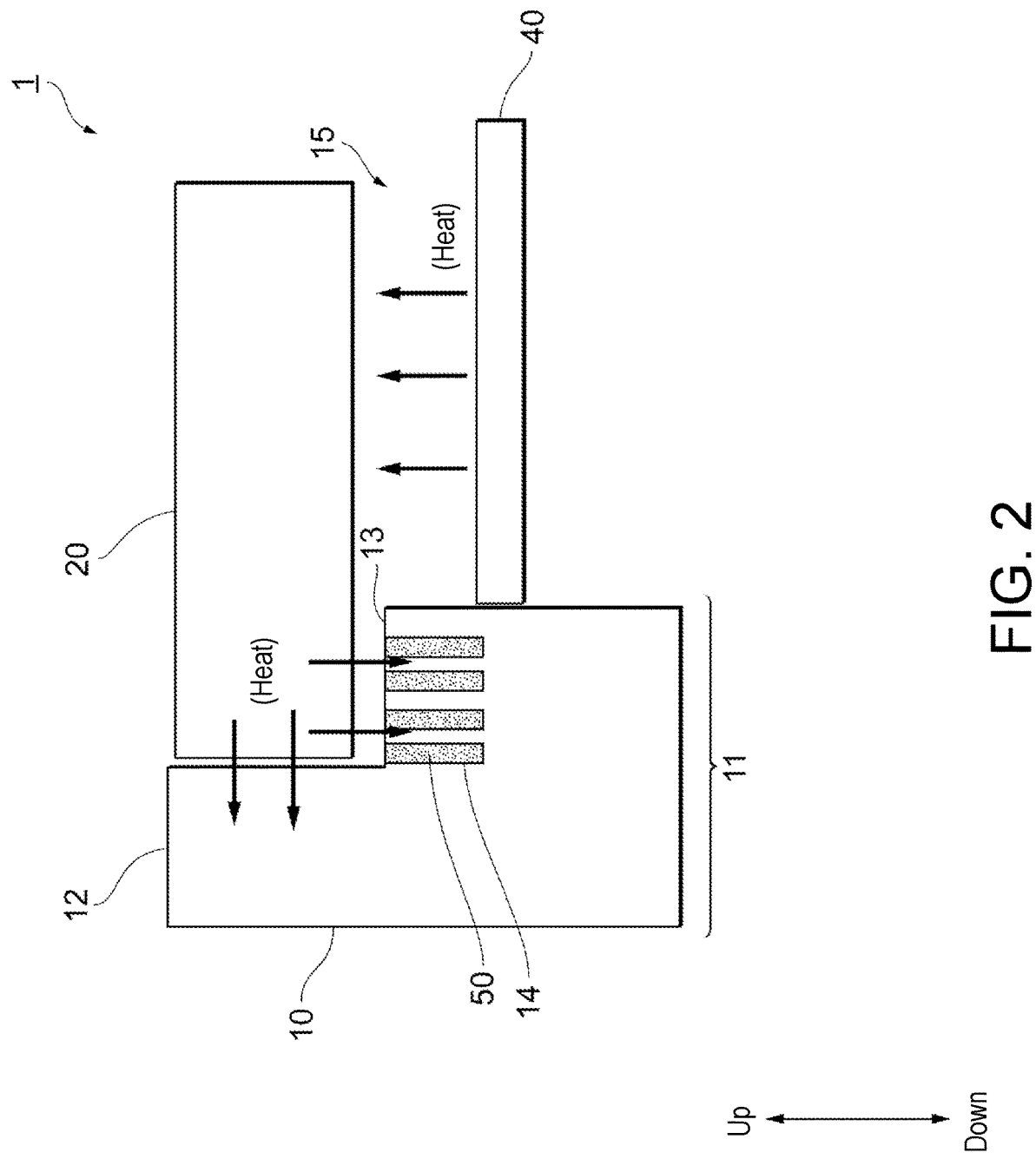
FIG. 2 is a schematic cross-sectional view showing a part of a metal housing and a metal lid of the sensor of FIG. 1.

Referring to FIG. 2, adhesion between the metal housing 10 and the metal lid 20 according to this embodiment by an adhesive agent 50 will be described. FIG. 2 is an enlarged cross-sectional view schematically showing an adhered portion between the metal housing 10 and the metal lid 20.

As shown in FIG. 2, a circuit board 40 is housed in the metal housing 10. For example, when an organic EL display is used as the display part, the circuit board 40 may have a control circuit for the organic EL display. With such a configuration, when the sensor 1 is provided with an organic EL display which is more vulnerable to heat than a liquid crystal display or the like, since the metal lid 20 is sealed by adhesion, the influence of heat on the organic EL display can be reduced as compared with welding by laser welding or the like.

When an LD is used as the light projecting element, for example, the circuit board 40 may have a laser control circuit. With such a configuration, in the sensor 1, the heat generated from the laser can be transferred to the metal housing 10 through the portion at which the metal housing 10 and the metal lid 20 come into contact with each other.

The second edge part 13 of the metal housing 10 is provided with one or more recesses 14. In the example of FIG. 2, although the recess 14 is provided in the second edge part 13, it may also be provided in the metal lid 20 or provided respectively in the metal lid 20 and the second edge part 13. The metal lid 20 is adhered to the second edge part 13 by a portion of the adhesive agent 50 filled in the recess 14 that is located in a region of an opening end of the recess 14.

According to the above configuration, in the sensor 1, since the heat generated from the circuit board 40 and transferred to the metal lid 20 is also transferred to the metal housing 10 through the portion at which the metal housing 10 and the metal lid 20 come into contact with each other, concentration on the metal lid 20 can be reduced. Accordingly, heat dissipation can be improved in the sensor 1 in which the metal lid 20 is adhered to the metal housing 10.

The recess 14 may be, for example, a columnar hole extending in the up-down direction. According to such a configuration, the adhesive agent 50 filled in the recess 14 can be formed to extend in a direction perpendicular to the portion located in the region of the opening end of the recess 14. Accordingly, in place of the portion of the adhesive agent 50 located in the region of the opening end of the recess 14, it is possible to secure a portion at which the second edge part 13 of the metal housing 10 and the metal lid 20 come into contact with each other. Further, according to the above configuration, since precision processing is not required for the formation of the recess 14 in the metal housing 10 or the metal lid 20, the cost for metal processing can be reduced.

The depth of the recess 14 may be selected, for example, to maximize the adhesion strength of the adhesive agent 50. Generally, it is known that the adhesion strength of the adhesive agent changes depending on the thickness of the adhesive layer of the adhesive agent. For example, if the adhesive layer becomes too thin, it may be vulnerable to peeling or impact, and conversely, if the adhesive layer becomes too thick, it may be vulnerable to shearing or tension. Therefore, by selecting the depth of the recess 14 to maximize the adhesion strength of the adhesive agent 50, in the sensor 1, the adhesion strength between the metal housing 10 and the metal lid 20 can be improved.

Figure 3:
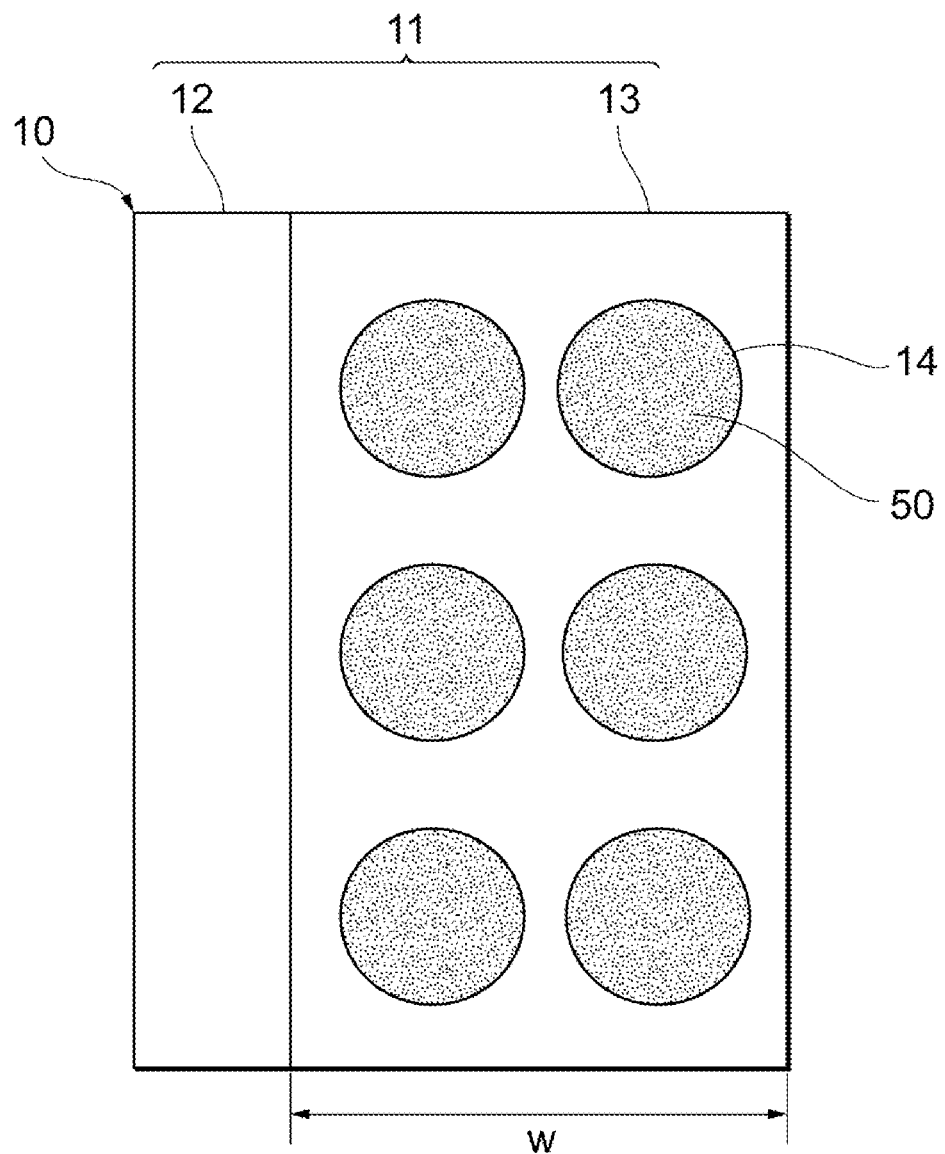
FIG. 3 is a view schematically showing an adhesion surface of the metal housing of the sensor of FIG. 1.

Referring to FIG. 3, an adhesion surface between the metal housing 10 and the metal lid 20 on the metal housing 10 will be described. FIG. 3 is a schematic view of a part of the adhesion surface of the metal housing 10 as viewed from above. As shown in FIG. 3, one or more recesses 14 having a circular opening end are provided in the second edge part 13 of the metal housing 10. The shape of the opening end is not limited to a circle and may be any shape as long as a certain area at the opening end can be secured. Further, a width W of the second edge part 13 serves as an adhesion margin for adhering the metal housing 10 and the metal lid 20. For example, in a top view, when the metal housing 10 has a substantially rectangular parallelepiped shape having a depth of about 15 mm, a length in the short axis direction of about 30 mm, and a length in the long axis direction of about 40 mm, the width W may be 0.5 to 2 mm.

The adhesive agent 50 adheres the metal lid 20 to the second edge part 13 by a portion located in the region of the opening end of the recess 14 (i.e., the portion shown in dotted patterns in FIG. 3). This portion is the adhesion surface between the second edge part 13 and the metal lid 20 at the recess 14. The total area of the adhesion surface may be equal to or less than half the area of a region in which the second edge part 13 and the metal lid 20 overlap with each other. In the example of FIG. 3, the overlapping region is a region overlapping with the metal lid 20 in the region of the second edge part 13 including the adhesion surface of the recess 14.

According to the above configuration, in place of the total area of the adhesion surface at the recess 14, it is possible to secure the area of the portion at which the metal housing 10 and the metal lid 20 come into contact with each other. Accordingly, the sensor 1 can easily transfer heat from the metal lid 20 to the metal housing 10 and can improve heat dissipation. Further, according to the above configuration, since it is not necessary to control the adhesion surface at the recess 14 by the size of the joining region with the metal lid 20 at the metal housing 10, it is possible to eliminate the influence on the joining strength due to accuracy variation of this size.

The embodiments described above are intended to facilitate the understanding of the disclosure and are not intended to limit the interpretation the disclosure. Each element included in the embodiments and its arrangement, material, condition, shape, size, etc. are not limited to those exemplified herein and may be changed as appropriate. In addition, the configurations shown in different embodiments may be partially replaced or combined.

APPENDIX

A sensor (1) including:
a metal housing (10) that houses a circuit board (40) electrically connected to a sensor element and is provided with an opening (15) and an edge part (11) defining the opening (15); and
a metal lid (20) adhered to the edge part (11) to cover the opening (15),
wherein at least one of the edge part (11) and the metal lid (20) is provided with one or more recesses (14), and the metal lid (20) is adhered to the edge part (11) by a portion of an adhesive agent (50) filled in the recess (14) that is located in a region of an opening end of the recess (14).

What is claimed is:

1. A sensor comprising:
a metal housing that houses a circuit board electrically connected to a sensor element and is provided with an opening and an edge part defining the opening; and
a metal lid adhered to the edge part to cover the opening,
wherein at least one of the edge part and the metal lid is provided with one or more a plurality of recesses, and the metal lid is adhered to the edge part by a portion of an adhesive agent filled in each of the plurality of recesses that is located in a region of an opening end of each of the plurality of recesses,
wherein the edge part includes a first edge part contacting an outer circumference of the metal lid and a second edge part adhered to the metal lid,
wherein the first edge part does not contain an adhered portion between the metal housing and the metal lid, and the metal lid is placed on the second edge part,
wherein the metal lid is fitted into the first edge part.

2. The sensor according to claim 1, wherein each of the plurality of recesses is a columnar hole.

3. The sensor according to claim 2, wherein a total area of an adhesion surface between the edge part and the metal lid at the plurality of recesses is equal to or less than half an area of an overlapping region between the edge part and the metal lid.

4. The sensor according to claim 2, wherein the circuit board has a control circuit for an organic EL display.

5. The sensor according to claim 2, wherein the circuit board has a laser control circuit.

6. The sensor according to claim 1, wherein a total area of an adhesion surface between the edge part and the metal lid at the plurality of recesses is equal to or less than half an area of an overlapping region between the edge part and the metal lid.

7. The sensor according to claim 6, wherein the circuit board has a control circuit for an organic EL display.

8. The sensor according to claim 6, wherein the circuit board has a laser control circuit.

9. The sensor according to claim 1, wherein the circuit board has a control circuit for an organic EL display.

10. The sensor according to claim 9, wherein the circuit board has a laser control circuit.

11. The sensor according to claim 1, wherein the circuit board has a laser control circuit.

\* \* \* \* \*